(12) United States Patent
Matter et al.

(10) Patent No.: US 9,634,232 B2
(45) Date of Patent: Apr. 25, 2017

(54) PIEZOELECTRIC SIGNAL GENERATOR

(75) Inventors: Dieter Matter, Zofingen (CH); Louis Marcel Meli, Kuesnacht (CH); Venkatesh Sivasubramaniam, Illnau (CH); Thomas Gartmann, Naenikon (CH); Markus Hutzler, Winterthur (CH); Abhilash Kizhakenath, Winterthur (CH)

(73) Assignee: Algra Holding AG, Cham (CH)

( * ) Notice: Subject to any disclaimer, the term of this patent is extended or adjusted under 35 U.S.C. 154(b) by 351 days.

(21) Appl. No.: 13/882,869

(22) PCT Filed: Sep. 14, 2011

(86) PCT No.: PCT/CH2011/000218
§ 371 (c)(1),
(2), (4) Date: Jun. 12, 2013

(87) PCT Pub. No.: WO2012/058777
PCT Pub. Date: May 10, 2012

(65) Prior Publication Data
US 2013/0249349 A1    Sep. 26, 2013

(30) Foreign Application Priority Data
Nov. 4, 2010 (CH) ..................... 1847/10

(51) Int. Cl.
*H01L 41/113* (2006.01)
*H02N 2/18* (2006.01)
*H03K 17/96* (2006.01)

(52) U.S. Cl.
CPC ........ *H01L 41/113* (2013.01); *H01L 41/1138* (2013.01); *H02N 2/18* (2013.01); *H03K 17/964* (2013.01); *H03K 2217/94089* (2013.01)

(58) Field of Classification Search
CPC ........................ H01L 41/113; H01L 41/1138
(Continued)

(56) References Cited

U.S. PATENT DOCUMENTS 6,630,894 B1 * 10/2003 Boyd et al. .................. 310/318
2010/0244629 A1   9/2010 Nagashima et al.

FOREIGN PATENT DOCUMENTS

EP         0 576 400         12/1993

OTHER PUBLICATIONS

International Search Report and Written Opinion for International Patent Application No. PCT/CH2011/000218 mailed Dec. 28, 2011.

* cited by examiner

*Primary Examiner* — Derek Rosenau
(74) *Attorney, Agent, or Firm* — McAndrews, Held & Malloy, Ltd.

(57) ABSTRACT

The piezoelectric signal generator (10;30) includes at least one piezoelectric element (12;20) connected with an emitter (14;35) which is capable of generating, from a current (C) produced by actuation of the piezoelectric element, an electromagnetic signal (S) capable of being wirelessly received by a receiver (16;36) removed from the signal generator (10;30), the piezoelectric element (20;31) comprises a piezoceramic layer (241) attached to an electrically conducting carrier stratum (242); the piezoceramic layer adheres to the carrier stratum and both are held by a positioning layer (23) which has a thickness ($T_P$), and both are capable of a reversible deformation, predetermined by and limited to the thickness ($T_P$) of the positioning layer (23); further, the piezoelectric element (20;31) comprises a gap layer (26) for buffering the reversible deformation of the carrier stratum (242) with the adhering piezoceramic layer (241); the gap (29) has a thickness ($T_G$) such that $T_G \leq T_P$.

20 Claims, 2 Drawing Sheets

PIEZOELECTRIC SIGNAL GENERATOR

This application is filed pursuant to 35 U.S.C. 371 as a U.S. National Phase application of International Patent Application No. PCT/CH2011/000218, which was filed Sept. 14, 2011, and claims the benefit of priority to Swiss Patent Application No. 1847/10, which was filed on Nov. 4, 2010. This application claims the benefit of priority to each of these applications, which are incorporated herein by reference in their entirety.

BACKGROUND AND PRIOR ART

The present invention relates generally to communication technology and specifically to a piezoelectric signal generator, i.e. a device which uses a piezoelectric element to activate an emitter for generating an electromagnetic signal. Various such devices have been suggested in the art, e.g. in U.S. Pat. Nos. 4,612,472, 6,630,894, DE 2 314 420, DE 2 939 440 and EP 1 217 742.

Such devices include at least one piezoelectric element which is connected with an emitter such that a current produced by the piezoelectric element will actuate the emitter and cause it to generate and send an electromagnetic signal to a receiver which is removed from the emitter. Depending upon the specific needs, the wavelength of the electromagnetic signal may be in the visible range or in the radio frequency range, e.g. in the ultra short wave range, and the distance between the emitter and the receiver may vary between a few centimetres and many meters or even kilometres.

However, few such products, if any, have lead to commercially viable products and most prior art disclosures do not specify the nature of the piezoelectric element that is postulated to be capable of actuating the emitter. When specifics about the piezoelectric element are given, such as in EP 1 217 742, commercially available bimorphs in the form of bending strips are suggested to provide for sufficient electrical energy, typically in the range of several mJ (millijoule; equivalent to mV·sec). Substantial deformation of such a piezoelectric element is required for actuation of the emitter and is, of course, detrimental to the useful life of a device so constructed.

OBJECTS AND BRIEF SUMMARY OF THE INVENTION

Accordingly, it is a main object of the invention to provide for a piezoelectric signal generator of the type mentioned above in which the deformation of the piezoelectric is limited while producing a sufficient electric energy to activate the emitter.

This object as well as further advantages apparent from the specification given below will be achieved by a piezoelectric signal generator as defined in claim 1. Preferred embodiments of the invention are as defined in claims 2-9. The invention further concerns a signalling system as specified in claim 10.

Surprisingly it has been found that the electric energy produced by controlled and limited deformation of a suitable piezoelectric element is capable of producing sufficient electric energy for actuation of energy-sensitive emitters.

Generally, a signal generator according to the invention includes at least one piezoelectric element in operative connection with an emitter which, in turn, is capable of generating, from a current produced by actuation of the piezoelectric element, an electromagnetic signal capable of being wirelessly received by a receiver removed from the generator.

The piezoelectric signal generator according to the invention includes at least one piezoelectric element in operative connection with an emitter, i.e. connected in such manner that the electric energy generated by the piezoelectric element will cause the emitter to produce and send an electromagnetic signal. Such emitters are known in the art, e.g. as explained in the above cited U.S. Pat. No. 6,630,894 and require no detailed explanation. Obviously, the piezoelectric element, i.e. the manual pressure required for its operation, is the only energy source of the emitter in a signal generator according to the present invention.

The specifics of the receiver depend upon the electromagnetic radiation received from the emitter. Again, such receivers are well known in the art and require no specific discussion herein.

Piezoelectric elements of the type suitable for use according to the present invention are known, e.g. from EP 0 210 386 and EP 0576 400 but require some specific features explained in more detail below. Generally, such elements include a piezoceramic layer that adheres to a carrier stratum made of, or coated with, an electrically conducting material, such as iron including steel, nickel, silver, or alloys.

The carrier stratum and its adhering piezoceramic layer must be capable of a repeated reversible deformation as required for generating the electric energy needed to activate the emitter by manual pressure of typically in the range of about 1 to about 20 Pascal, and such repeated deformation must not cause damage to the piezoceramic layer nor to its energy generating capacity. Suitable products are available commercially and typically include a circular metal disc, e. g. made of steel, having a thickness in the range of from about 0.05-0.5 mm, preferably from about 0.1-0.3 mm, with an adhering layer of piezoceramic layer typically having a thickness in the same range as the metal disc that serves as a carrier stratum for the piezoceramic layer. Typically, the thickness of the ceramic layer is about the same as that of its carrier stratum. While circular shapes are preferred for reasons of structural simplicity, this is not critical and other round or polygonal structures will be suitable if the positioning layer and the gap layer are suitably shaped to provide for peripheral support of the carrier stratum. Diameters for circular discs, or the largest diameter for non-circular shapes may vary, e.g. between about 5 and about 50 mm.

For the purpose of the invention it is essential that the deformation of the piezoceramic layer is kept within carefully selected limits. While a minimum deformation does not appear to be critical insofar as the operating life of the element is concerned, it is obvious that such minimum will depend upon the minimum piezoelectric power required to activate the emitter. Maximum deformation, on the other hand, is believed to be crucial and requires careful limitation. It has been found, according to the invention, that such limitation can be achieved by limiting the thickness of a gap which acts as a stopper for the degree of deformation that occurs upon activation of the signal generator. Obviously, the carrier stratum of the piezoceramic layer must be selected such that the piezoceramic layer will be sufficiently deformed to generated the electric energy required for activating the emitter. Generally, the gap thickness according to the invention will be in the range of from about 0.05 to about 0.50 mm, preferably in the range of from about 0.1 to about 0.25 mm Preferred examples of metals suitable for the carrier stratum are stainless steel (e.g. SUS304), FeNi-alloy combinations, brass aloys and other metals with similar physical and chemical properties.

DEFINITIONS

The term "synthetic polymer" as used herein is intended to include macromolecular substances such as polyesters, polyethers, polycarbonates, polyalkanes or the like materials which are typically electrically insulating and conventionally used in the art of producing laminated structures such as boards for printed circuits.

The term "electrically conducting" refers to materials which are inherently electrically conductive, such as metals or graphite, or have been rendered electrically conductive by coating. Typical metals include steel, nickel, chromium, aluminum, magnesium, copper, silver, gold, and alloys of such metals.

The term "reversible deformation" refers to a reversible change of shape of the carrier stratum with its adhering piezoceramic material and is expressed herein in terms of length units measured at the site of maximum deformation, i.e. the distance between the positions of that part of the carrier stratum where maximum deformation occurs when at rest and when being deformed.

The term "piezoceramic material" refers to a crystalline material that exhibits piezoelectric properties and can be made to adhere to a carrier, e.g. by method used in the manufacture of ceramics. Such materials are available commercially under various trademarks or trade names from various producers and require no further discussion.

The term "adhesive" herein refers to materials used in the laminating art to produce multilayered structures for use in the electric and electronic arts. Thermoplastic polymers and mixtures thereof with or without solvents are typical examples.

The term "about" when used in connection with a numeric statement herein is intended to include a margin of error of ±30%.

PREFERRED EMBODIMENTS

The invention will now be explained and illustrated in more detail with reference to preferred yet not limiting embodiments of the invention while referring to the attached drawings in which.

Figure 1:
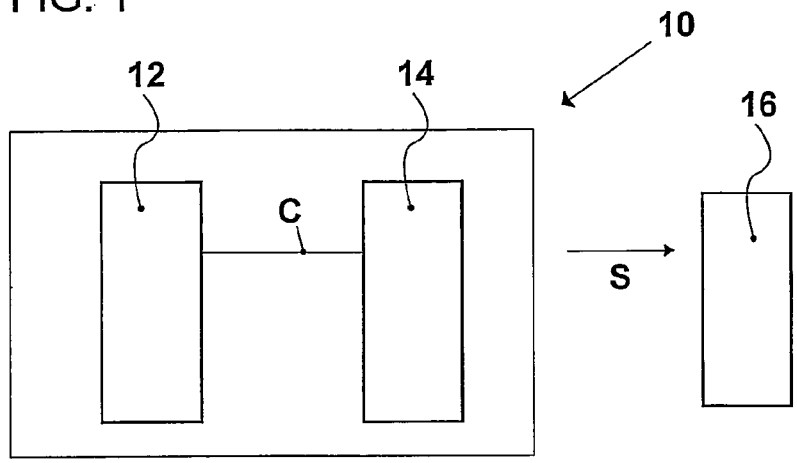
FIG. 1 is a block diagram of a signalling system according to the invention.

As shown in FIG. 1, a system according to the invention comprises a piezoelectric signal generator 10 which includes one or more piezoelectric elements 12 producing a current C for actuating an emitter 14 so as to generate an electromagnetic signal S that will be transmitted to and received by receiver 16. The nature of receiver 16 depends, of course, upon the type of electromagnetic radiation that is generated by transmitter 14. i.e. whether it is in the radio range or in the visual range including its IR and UV portions.

Figure 2:
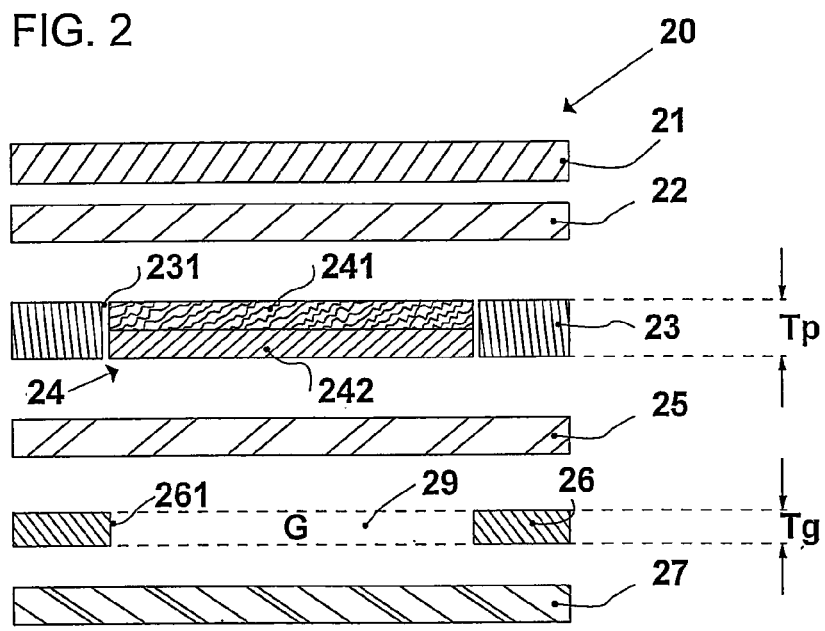
FIG. 2 is a diagrammatic exploded sectional view of the main constituents of a piezoelectric element.

An example of the constituents of a piezoelectric element 12 of FIG. 1 for use according to the invention is schematically presented as an exploded view in FIG. 2 showing the essential constituent layers of a preferred piezoelectric element 20 according to the invention. It includes an upper or top layer 21 for adhesive connection with an electrically conductive layer 22. While this may be a layer consisting entirely of an electrically conducting material, it might as well consist of a dielectric material with embedded conductive portions for contacting the adjacent portion of piezoceramic layer 23 which, in turn, is adheringly connected to carrier stratum 242. The piezoceramic layer 241 together with carrier stratum 242 forms a piezoelectric unit structure 24 such as available commercially from various manufacturers.

The piezoelectric unit structure 24 has the shape of a circular disc and is surrounded by positioning layer 23 having an opening to receive and closely hold structure 24. The upper and lower surfaces of positioning layer 23 are essentially flush with the upper and lower surfaces of piezoelectric unit structure 24. In other words, the thickness $T_P$ of positioning layer 23 is essentially the same as that of piezoelectric unit 24.

The next layer of element 20 is another electrically conductive layer 25 contacting carrier stratum 242. Again, as with the upper conductive layer 22, the lower conductive layer may be electrically conductive only in the area for contacting support 242 and forming a lead for electrical connection with the emitter.

Layer 26 is the gap layer and consists typically of a dielectric material. As will be apparent (cf. FIG. 3) the inner edge 261 of gap layer 26 protrudes more toward the centre of gap 29 than the corresponding inner edge 231 of positioning layer 23. As a consequence, carrier stratum 242 is peripherally supported by gap layer 26 which, in turn is in adhesive contact with a base layer 27 which may be either dielectric or metallic. The thickness $T_G$ of gap 29 is substantially defined by and equal to the thickness of layer 26.

Figure 2A:
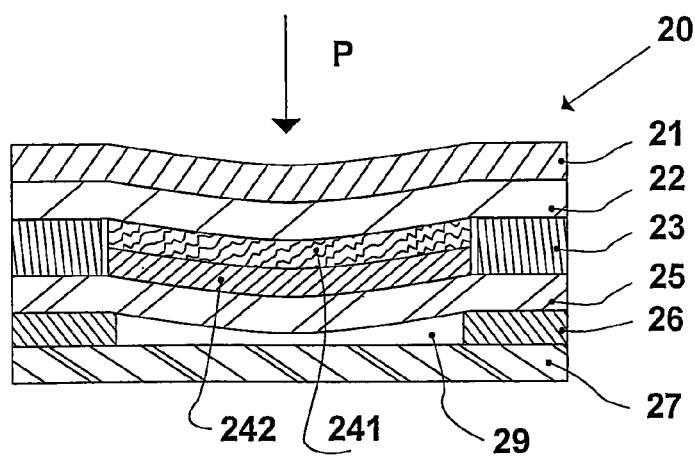
FIG. 2A is a diagrammatic sectional view of the element of FIG. 2 in operative connection when being actuated by manual pressure.

FIG. 2A shows all layers of FIG. 2 in their operational relation as a multilayered integral stack of a plurality of laminated layers when actuated by a manual pressure P acting from above (a lower support of element 20 being omitted in FIG. 2A), e.g. by a manual pressure of typically in the range of about 2 to about 20 Pa. As a consequence, all layers on top of gap layer 26 will be deformed but generally not compressed, and an electric current will be generated by piezoceramic layer 241.

It is to be noted that the thickness of the layers in FIGS. 2 and 2A has been greatly exaggerated for purposes of illustration. In reality, the entire stack of FIGS. 2 and 2A generally will be a thin laminate having a thickness of not substantially more than about one 1 mm. Also, the proportions shown in FIGS. 2, 2A are not realistic but serve but for illustration and understanding. Typically, layer 25 is substantially thinner than both its adjacent layers 23 and 26. Accordingly, in actual practice, bending deformation of piezoceramic layer 241 will actually be limited by the thickness of gap 29, i.e. by the thickness $T_G$ of gap layer 26.

Figure 3:
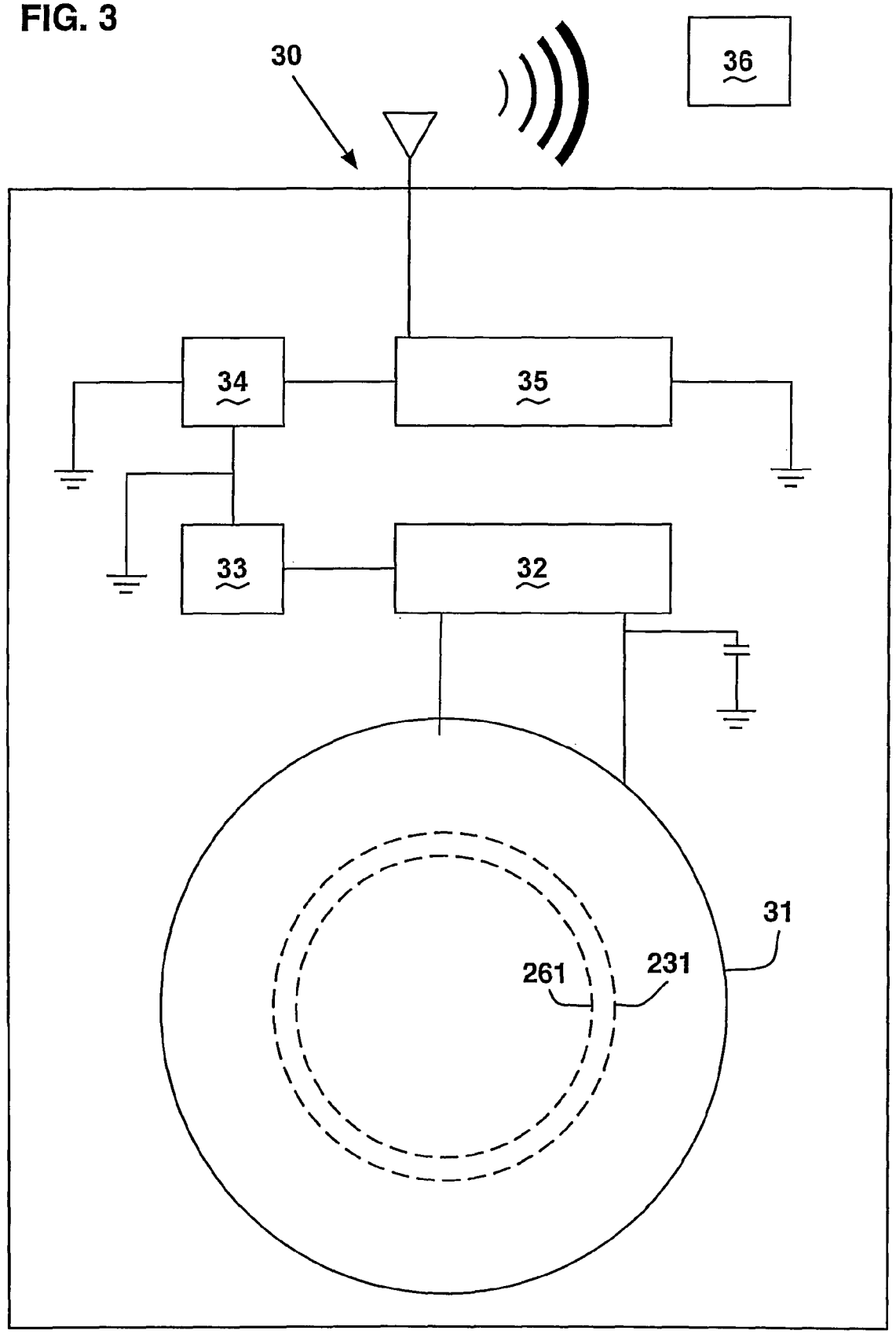
FIG. 3 is a diagrammatic view of a piezoelectric signal generator according to the invention.

As is apparent from FIGS. 2, 2A, and 3, the opening in positioning layer 23 that holds unit 24 is circular and defined by an edge 231. Gap 29, in turn is circular and cocentric with the circular opening of layer 23 that holds the piezoelectric unit 24.

Obviously, while gap 29 in FIG. 2 is formed by a total penetration of the gap layer, the same deformation-limiting function can be achieved by a layer having a larger thickness but where the gap is formed by a recess in one—when referring to FIG. 2, the "upper"-surface of the gap layer. In such a case, the recess will serve as the gap and have the appropriate depth $T_G$.

Preferably, gap 29 has a thickness $T_G$ of not more than about half the thickness $T_P$ of the positioning layer 23 and typically is in the range of from about 0.1 to about 0.3 mm. In that context it is to be noted that peripheral support of carrier stratum 242 by the inner face or edge 261 of gap layer 26 is essential. For this reason, the diameter of gap 29 must not exceed the diameter of carrier stratum 242. If these diameters are equal, the intermediate layer 25 may provide a minimum difference just sufficient for peripheral support. Generally, however, the diameter gap 29 will be somewhat smaller than the diameter of carrier stratum 242, typically by about 0.5 to about 2 mm, preferably by about 1 mm, so as to provide for substantial bending of stratum 242 upon impact of a manual pressure P over most of its plane even though the spatial displacement is limited by gap 29 as explained above.

By the same token, the mechanical properties of gap layer 26 must be such as not to be compressed upon impact of the operating pressure P, i.e. any change of the thickness $T_G$ of gap layer 26 at operating conditions, typically at room temperature, must be below 1%, preferably below 0.1% of its thickness when not being exposed to the impact of operating pressure P. Preferably, this condition should be met by all constituents of the piezoelectric element.

FIG. 3 is a diagrammatic view of a piezoelectric signal generator 30. The piezoelectric element 31 is shown in top view, and only the inner edges 231 and 261 (cf. FIG. 2) of the corresponding positioning layer 23 and gap layer 26 are shown in broken lines to illustrate the peripheral support of carrier stratum 242 by gap layer 26. Actually, the difference in diameters typically is small.

As is apparent from the diagrammatic circuit shown in FIG. 3, the output electricity generated by piezoelectric element 31 is lead to the constituents of a preferred form of an emitter, namely a rectifier 32, a voltage regulator 33, a voltage detection unit 34 and a micro controller unit 35 for transmitting a signal to a receiver 36 remote from signal generator 30.

The above disclosed piezoelectric elements used in signal generators according to the invention with a limited and predetermined maximum deformation of the piezoceramic layer are capable of generating in a one-stroke operation of a manual pressure P an electric energy which typically is in the range of from about 1 to about 1000μJ (microjoules), preferably at least about 10μJ, the upper limit being defined by the amount of electricity that can be generated by the piezoelectric and which is capable to generate by means of the emitter a signal that can be transmitted over technologically significant distances.

It will be apparent for those familiar with the art of piezoelectric switches that the above examples are for illustration and are not intended to limit the invention. For example, while the multilayered structure shown above preferably are be made from preformed layers by laminating methods, some or all layers may be applied by sheet-forming methods, such as casting or printing.

The invention claimed is:

1. A piezoelectric signal generator (10;30) including at least one piezoelectric element (12;20) operatively connected with an emitter (14;35) for generating, from a current (C) produced by actuation of said at least one piezoelectric element, an electromagnetic signal (S) being wirelessly received by a receiver (16;36) removed from said signal generator (10;30); wherein said at least one piezoelectric element (20;31) comprises a piezoceramic layer (241) adhering to an electrically conducting carrier stratum (242), each of said piezoceramic layer (241) and said electrically conducting carrier stratum (242) being substantially planar, wherein the periphery of the piezoceramic layer (241) and of the electrically conducting carrier stratum (242) are each fixedly held by a positioning layer (23) having a thickness ($T_P$), thereby preventing movement of the periphery of the piezoceramic layer (241) and the electrically conducting carrier stratum (242) at the positioning layer (23); said electrically conducting carrier stratum (242) together with said adhering piezoceramic layer (241) being configured for reversible deformation; and said piezoelectric element (20; 31) comprising a gap layer (26) positioned next to the piezoceramic layer (241) adhering to the electrically conducting carrier stratum (242) for limiting said reversible deformation by means of a gap (29) having a thickness ($T_G$) such that $T_G < T_P$.

2. The signal generator (10) according to claim 1 wherein said electrically conducting carrier stratum (242) is a metal disc (242) peripherally supported by said gap layer (26).

3. The signal generator (10) according to claim 1 wherein said electrically conducting carrier stratum (242) is a metal disc (242) peripherally supported by said gap layer (26) and wherein said electrically piezoceramic layer (241) and said carrier stratum (242) form a coherent unit (24) having a thickness substantially equal to the thickness ($T_P$) of the positioning layer (23).

4. The signal generator (10) according to claim 1 wherein the thickness ($T_P$) of the positioning layer is in the range of from about 0.1 mm to about 1 mm.

5. The signal generator (10) according to claim 1 wherein the thickness ($T_G$) of the gap (29) is in the range of from about 0.05 mm to about 0.5 mm.

6. The signal generator (10) according to claim 1 wherein said electrically conducting base stratum (15) is capable of said predetermined and limited deformation in response to a manual pressure in the range of from about 1 to about 20 Pa.

7. The signal generator (10) according to claim 1 wherein said piezoelectric element (20) is an integrally laminated structure comprising, in sequence, an overlay layer (21); a first connector layer (22) adjacent said positioning layer (23) for contacting said piezoceramic layer (241); a second connector layer (25) for contacting said electrically conducting carrier stratum (242); said gap layer (26) being positioned between said second connector layer (25) and at least one base layer (27).

8. The signal generator (10) according to claim 1 wherein said electrically conducting carrier stratum (242) is a metal disc (242) peripherally supported by said gap layer (26) and wherein said metal disc (242) has an essentially circular shape, a diameter in the range of from about 10 mm to about 50 mm, and forming with said piezoceramic layer (241) a piezoelectric unit (24) having a thickness in the range of from about 0.1 mm to about 1.0 mm.

9. The signal generator (10) according to claim 1 wherein
   (i) said electrically conducting carrier stratum (242) is a metal disc (242) peripherally supported by said gap layer (26),
   (ii) said metal disc (242) has an essentially circular shape, a diameter in the range of from about 10 mm to about 50 mm, and forming with said piezoceramic layer (241) a piezoelectric unit (24) having a thickness in the range of from about 0.1mm to about 1.0 mm,
   (iii) said thickness ($T_P$) of said positioning layer is essentially the same as that of piezoelectric unit (24), and (iv) said gap (29) has an essentially circular shape and is co-centric with said circular disc, and wherein the diameter of said gap (29) is not greater than said diameter of said piezoelectric unit (24).

10. The signal generator (10) according to claim 1 wherein the thickness ($T_P$) of the positioning layer is in the range of from about 0.2 to about 0.5 mm.

11. The signal generator (10) according to claim 1 wherein the thickness ($T_G$) of the gap (29) is in the range of from about 0.1 to about 0.25 mm.

12. The signal generator (10) according to claim 1 wherein
(i) said electrically conducting carrier stratum (242) is a metal disc (242) peripherally supported by said gap layer (26),
(ii) said metal disc (242) has an essentially circular shape, a diameter in the range of from about 10 mm to about 50 mm, and forming with said piezoceramic layer (241) a piezoelectric unit (24) having a thickness in the range of from about 0.1mm to about 1.0 mm, and
(iii) said thickness ($T_P$) of said positioning layer is essentially the same as that of piezoelectric unit (24), and
(iv) said gap (29) has an essentially circular shape and is co-centric with said circular disc, and wherein the diameter of said gap (29) is smaller than said diameter of said piezoelectric unit (24) by about 0.5 mm to about 2.5 mm.

13. A signalling system comprising a receiver (16;36) and a piezoelectric signal generator (10;30) including at least one piezoelectric element (12;20) operatively connected with an emitter (14;35) for generating, from a current (C) produced by actuation of said at least one piezoelectric element, an electromagnetic signal (S) being wirelessly received by the receiver (16;36) removed from said signal generator (10;30), wherein said at least one piezoelectric element (20;31) comprises a piezoceramic layer (241) adhering to an electrically conducting carrier stratum (242) each of said piezoceramic layer (241); and said electrically conducting carrier stratum (242) being substantially planar, wherein the periphery of the piezoceramic layer (241) and of the electrically conducting carrier stratum (242) are each fixedly held by a positioning layer (23) having a thickness ($T_P$), thereby preventing movement of the periphery of the piezoceramic layer (241) and the electrically conducting carrier stratum (242) at the positioning layer (23); said electrically conducting carrier stratum (242) together with said adhering piezoceramic layer (241) being configured for reversible deformation; said piezoelectric element (20;31) comprising a gap layer (26) positioned next to the piezoceramic layer (241) adhering to the electrically conducting carrier stratum (242) for limiting said reversible deformation by means of a gap (29) having a thickness ($T_G$) such that $T_G \leq T_P$.

14. A piezoelectric signal generator comprising:
a piezoelectric element operatively connected with an emitter to generate, from a current produced through actuation of said piezoelectric element, an electromagnetic signal, the electromagnetic signal being wirelessly transmitted to a receiver situated remotely from said signal generator;
wherein said piezoelectric element includes a piezoceramic layer adhered to an electrically conducting carrier stratum, each of said piezoceramic layer and said electrically conducting carrier stratum being substantially planar;
wherein the periphery of the piezoceramic layer and of the electrically conducting carrier stratum are fixedly held by a positioning layer having a thickness ($T_P$), thereby preventing movement of the periphery of the piezoceramic layer and the electrically conducting carrier stratum at the positioning layer;
said electrically conducting carrier stratum, together with said adhered piezoceramic layer, being configured for reversible deformation; and
said piezoelectric element comprising a gap layer positioned adjacent the piezoceramic layer adhered to the electrically conducting carrier stratum for limiting said reversible deformation by means of a gap having a thickness ($T_G$) such that $T_G \leq T_P$.

15. The piezoelectric signal generator of claim 14, wherein said electrically conducting carrier stratum is a metal disc peripherally supported by said gap layer.

16. The piezoelectric signal generator of claim 15, wherein said electrically piezoceramic layer and said carrier stratum form a coherent unit having a thickness substantially equal to the thickness ($T_P$) of the positioning layer.

17. The piezoelectric signal generator of claim 14, wherein said electrically conducting base stratum is capable of said predetermined and limited deformation in response to a pressure in the range of from about 1 Pa to about 20 Pa.

18. The piezoelectric signal generator of claim 14, wherein said piezoelectric element is an integrally laminated structure comprising, in sequence, an overlay layer; a first connector layer adjacent said positioning layer for contacting said piezoceramic layer; a second connector layer to contact said electrically conducting carrier stratum; said gap layer being positioned between said second connector layer and at least one base layer.

19. The piezoelectric signal generator of claim 15, wherein said metal disc is substantially circular in shape, with a diameter in the range of from about 10 mm to about 50mm, and said metal disc forming with said piezoceramic layer a piezoelectric unit having a thickness in the range of from about 0.1 mm to about 1.0 mm.

20. The piezoelectric signal generator of claim 15, wherein
(i) said metal disc is substantially circular in shape, with a diameter in the range of from about 10 mm to about 50 mm, and said metal disc forming with said piezoceramic layer a piezoelectric unit having a thickness in the range of from about 0.1 mm to about 1.0 mm,
(ii) said thickness ($T_P$) of said positioning layer is substantially the same as that of piezoelectric unit, and
(iii) said gap is substantially circular shape and is co-centric with said metal disc, and wherein the diameter of said gap is not greater than said diameter of said piezoelectric unit.

* * * * *